United States Patent [19]

Wan et al.

[11] Patent Number: 4,989,246

[45] Date of Patent: Jan. 29, 1991

[54] ADAPTIVE DIFFERENTIAL, PULSE CODE MODULATION SOUND GENERATOR

[75] Inventors: Shyue-Yun Wan, Hsin Chu; Shie-Ming Peng, Taur Yuan; Der-Chwan Wu, Nan Tour, all of Taiwan

[73] Assignee: Industgrial Technology Research Institute, R.O.C., Hsinchu, Taiwan

[21] Appl. No.: 326,993

[22] Filed: Mar. 22, 1989

[51] Int. Cl.$^5$ .............................................. G10L 5/00
[52] U.S. Cl. ................................................ 381/40; 360/8
[58] Field of Search ............................... 381/40; 360/8

[56] References Cited

U.S. PATENT DOCUMENTS

| | | | |
|---|---|---|---|
| 3,909,532 | 9/1975 | Rabiner et al. | 381/41 |
| 4,184,049 | 1/1980 | Crochiere | 381/41 |
| 4,376,874 | 3/1983 | Karban et al. | 381/34 |

Primary Examiner—Emanuel S. Kemeny
Attorney, Agent, or Firm—Hung C. Lin

[57] ABSTRACT

A sound generator for storing and reproducing audio signal with reduced memory storage, which is accomplished by: (a) the technique of Adaptive Differential Pulse Code Modulation (ADPCM), and (B) the elimination of silence period from memory storage but regenerating the silence signal at output.

3 Claims, 4 Drawing Sheets 0 1 1 1 1 0 1 0 0 0 0 1 1 1 0

```
        0 0 0 1 1 0 1 1
      ┌─────────────────┐
  0 0 │ 0 │ 1 │ 1 │ 1 │
      ├───┼───┼───┼───┤
  0 1 │ 1 │ 0 │ 1 │ 0 │
      ├───┼───┼───┼───┤
  1 0 │ 0 │ 0 │ 0 │ 0 │
      ├───┼───┼───┼───┤
  1 1 │ 1 │ 1 │ 1 │ 0 │
      └─────────────────┘
```

ADAPTIVE DIFFERENTIAL, PULSE CODE MODULATION SOUND GENERATOR

BACKGROUND OF THE INVENTION

This invention relates to technique of ADPCM (Adaptive Differential Pulse Code Modulation) for implementating sound synthesizers.

Generally, there are two methods of sound synthesis. One is the Frequency Domain method, including Linear Prediction Code (LPC) method and Formant method, etc., which was mainly developed for human voice but not suitable for the animal sound. Another sound disposition method is the Time Domain method, including Pulse Code Modulation (PCM), Adaptive Differential Pulse Code Modulation (ADPCM) and Continuously Variable Slope Delta Modulation (CVSD).

The advantage of the PCM, ADPCM, CVSD technologies is that their control circuits are quite simple. But the shortcoming is that they need quite large memories. Therefore, how to reduce the needed memory while not sacrificing the quality of sound is a concern of research.

In general, a silence sound exists between two words or two sentences in human voice and it takes 20%–40% of the whole sound. So does the animal sound. Therefore, if the silence sound can be eliminated while saving the silence data and adding it automatically during regeneration, the needed memory for sound storage can be decreased and distortless quality is maintained. The disposition of silence sound in the TMS 5200 Speech Synthesizer produced by TI CO., U.S.A. is encoded by four bit "0" to express 20 ms silence sound; U.S. Pat. No. 4,449,190 develops a set of codes to express silence sound; U.S. Pat. No. 4,701,937 is based on the PCM technology and defines a fixed value automatically at the output for the silence sound. The difference between this invention and the above-mentioned patents is to utilize the circuit structure of the ADPCM technology to make an adder add 0 for silence sound and the power remains at the same level with the previous signal.

The sound effects of animals or others have the property of sound repetition. For example, the bark of a dog "Wang-Wang", "Wang -Wang -Wang" which only needs repetition of once of the first sound twice of the second sound. Hence, half or even more memory is redundant.

As to the ADPCM Coding and Encoding technologies, many dissertations have been published in the past. The basic structure of this invention is based on the theory by S. L. Bates "A Harward Realization of PCM-ADPCM Code Converter" M.S. thesis, MIT, Cambridge, Mass., Jan. 1976. In this thesis, multiplication is replace by addition. The theory and structure of ADPCM are stated very clearly in the thesis and there is no need to describe here. One difference between the present invention and the above-mentioned thesis is that the present invention encodes the data in the computer and stores those codes of sound in the memory. Afterwards, the memory device will be combined with the Decoder to become the Speech Synthesizer. Another difference is that the silence sound is represented by 0000 code which is not stored in the memory but generated by Address Generator Decoder and the stop signal is represented by 1000. When the control circuit detects and gets the code of 1000, it terminates decoding and the sound ends.

SUMMARY OF THE INVENTION

An object of this invention is to store and generate sound with minimum memory capacity.

Another object of this invention is to eliminate the storage of silent signal in the memory.

A further object of this invention is to generate repetitions wound without additional memory space.

This invention utilizes the ADPCM method, Silence Elimination method, Period Repetition Control method, etc. to implement a sound regenerating device. As to the Coding, the sound will be converted from analog to digital PCM code by utilizing a computer and then transformed to ADPCM code. Specifically, the sound is encoded into the following three sets of codes; namely (1) ADPCM Speech Data code, (2) Step Size code and (3) Function Selection code, by utilizing the Silence Elimination and Period Repetition Control method. When the device receives the trigger signal, the PCM code data in the ROM will be transferred and output through DAC utilizing the ADPCM decoding method. During the processing of the PCM code, the silence sound will automatically be inserted by editing the Address to reproduce the original sound.

The difference between the current speech data and the speech data of prior art is that the prior art data are represented by 16 codes i.e., 0000, 0001,0010,0011 . . . 1000, 1001 . . . 1110,1111 for the ADPCM 4 bit Decoding and Encoding System. This invention sets 0000 to be Silence code, which renders the Adder to stop functioning, and output the same status as the previous one when the Control circuit detects and receives 0000. However, the Adder functions again when the receiving data is not 0000. Furthermore, when the receiving data code is 1000, the Sound Generator stops functioning.

BRIEF DESCRIPTION OF THE DRAW

FIG. 1: Typical sound waveform (a) with different sound frame including a silence frame; (b) divided into time steps.

FIG. 2: A 16-bit data for storage.

FIG. 3: Memory matrix for 4-bit address code.

FIG. 4: Decoder and memory matrix for eliminating silence sound period storage.

FIG. 5: Symbols for MOSFETs (a) Enhancement Mode; (b) Depletion Mode.

FIG. 6: Block diagram of sound generator of the present invention.

DETAILED DESCRIPTION OF THE PROPOSED EMBODIMENT

Figure 1A:
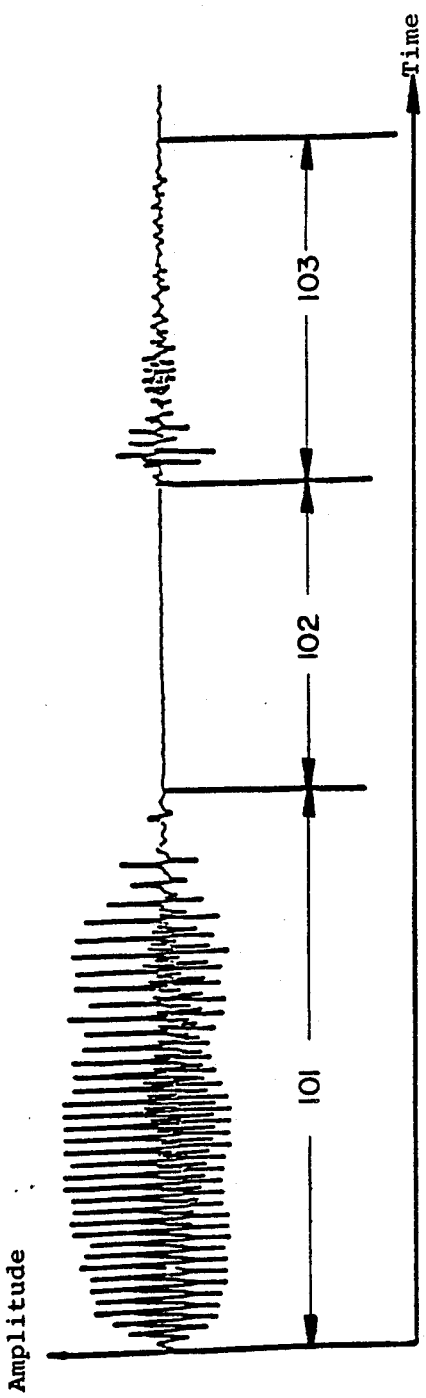

In speech signals, the sound wave forms generally certain percentage of silence period. During the silence period, the waveform does not vary with time. For example in FIG. 1(a), the waveform of the word "six" is shown, where the ordinate represents the amplitude of the sound and the abscissa represents time. In this figure, the periods 101 and 103 show that the amplitudes vary with time, while the period 102 shows that amplitude does not vary with time and is customarily referred to as the "Silence" period. In speech signals, the silence periods ordinarily occupy about 20 to 40 percent of time.

Speech is an analog signal. After sampling, the analog signal can be converted into a digital signal. The "Pulse Code Modulation" (PCM) is an example of this technique. The digital signal can be stored in a memory. If the PCM signal occupies too large a memory, the PCM signal can be converted into an "Adaptive Differential Pulse Code Modulation" (ADPCM) code. During replay, the digital signal stored in the memory can be decoded and converted back into an analog signal. This decoding and regeneration technique is well known in the art. A reference can be found in the book "Waveform Quantization and Coding" by N. S. Jayant.

Figure 1B:
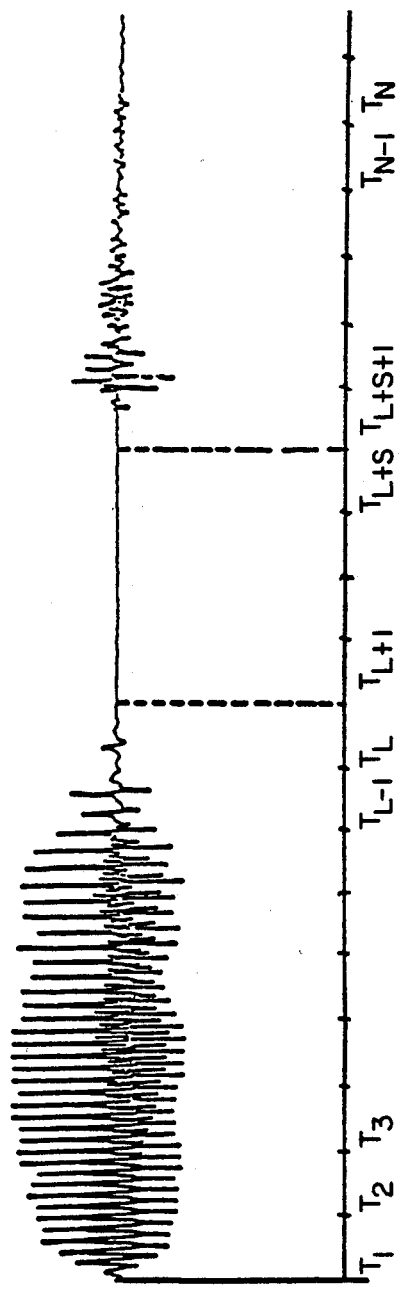

For the storage of the PCM or ADPCM codes in a memory, the format is shown in FIG. 1(b). The sound is divided into N sections. Every section is called a "frame". Every frame contains F points. (There are 128 points in this invention). For PCM code, each point is composed of 12 bits. For ADPCM codes, each point is composed of 4 bits. In a memory each address $T_1$, $T_2$ ... or $T_N$, represents the signal of each frame. In FIG. 1(b), $T_{L+1}$, ... $T_{L+S}$ frames represent silence, i.e. the signal maintains a fixed value. Therefore it the circuit can automatically produce a constant value when the address increments from $T_L$ to $T_{L+1}$ ... to $T_{L+S+1}$ and then the silence period no longer requires memory to store the information. In this manner, the memory can conserve the space for storage.

Figures 2, 3, 5A, 5B:
Figure 4:
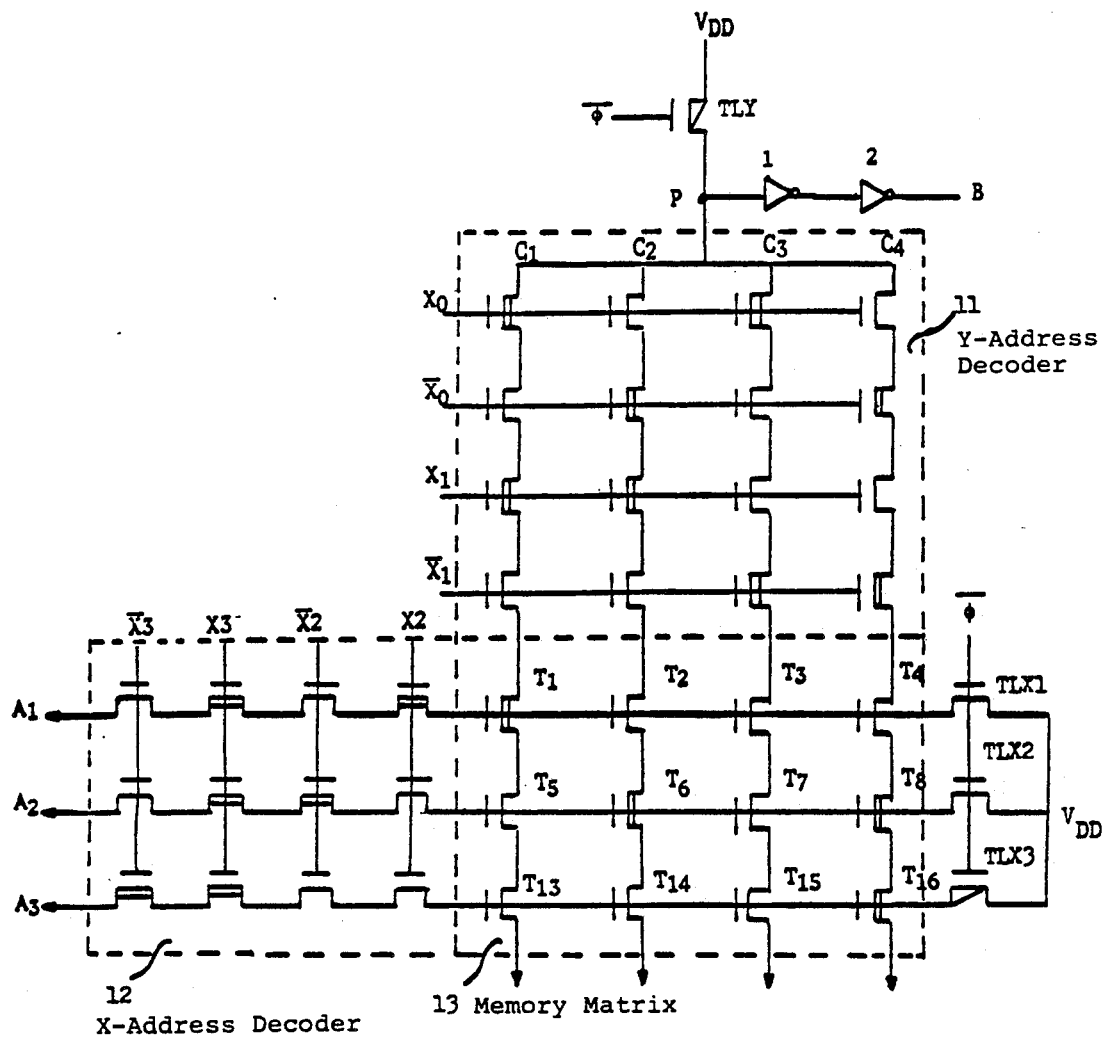

The method for eliminating the silence period is shown in FIGS. 1, 3, and 4. FIG. 2 represents the information for a 16 bit information. If time interval is represented by address codes $X_3X_2X_1X_0$, code 0000 represents the first interval; code 0001 represents the second time interval. In this manner, the time intervals are represented by binary numbers. A sample data in FIG. 2 is sequentially stored in the memory. Every address has one data as shown in FIG. 3. In FIG. 3, it can be seen that the information from address code 1000 to 1011 is all 0. Thus, during circuit design a "0" is automatically made to generate between 1000 to 1011. Then the memory space can be conserved. FIG. 4 shows the actual circuit implementation of the memory map in FIG. 3. At the same time, the memory storage for the address code 1000 to 1011 is eliminated. The automatic generation of "0" data between address codes 1000 to 1011 is based on the following circuit principle.

The circuit depicted in FIG. 3 is composed of a number of MOS Field Effect Transistors (MOSFET). There are two types of MOSFETs. One type is called Enhancement Mode MOSFET as symbolized by FIG. 5(a), in which there is no conduction between the drain $V_{DD}$ electrode and the source electrode $V_{SS}$ when the gate electrode G is at zero bias with respect to the source. Another type is called depletion mode MOSFET as symbolized by FIG. 5(b), in which there is conduction between the drain $V_{DD}$ and the source $V_{SS}$ when the gate electrode G is at zero bias with respect to the source.

The memory matrix as shown in FIG. 4 is composed of four parallel 7-input vertical AND logic gates and three parallel horizontal AND logic gates. The vertical AND logic gates are along four columns, $C_1$, $C_2$, $C_3$, $C_4$ with common inputs and one common load device TLY, which can be turned on by a clock $\bar{\phi}$. The horizontal AND logic gates are along three rows $A_0$, $A_1$, $A_2$ and have separate load devices TLX1, TLX2, TLX3 which can also be turned on by a clock $\bar{\phi}$. Four of the seven vertical inputs for the vertical AND logic gates are controlled by the two less significant bits of the address codes, $X_0$, $\overline{X}_0$, $X_1$, $\overline{X}_1$ and these input MOSFETs form an address decoder 11 for the two less significant bits. The four input MOSFETs for the horizontal AND logic gates are controlled by the two more significant bits of the address codes, $X_2$, $\overline{X}_2$, $X_3$, $\overline{X}_3$ and these input MOSFETs form an address decoder 12 for the two more significant bits. The remaining input MOSFETs for the vertical AND logic gates form a memory matrix 13 with gates of input MOSFETs controlled by the outputs of the three horizontal AND logic gates.

In the memory matrix shown in FIG. 4, the depletion mode MOSFETs are for storing logic "0"; the enhancement mode logic for storing logic "1". When the clock $\bar{\phi}$ is high the load MOSFET TLY is on. If the address code is 0000, row $A_1$ and column $C_1$ of the address decoders 11 and 12 respectively are conducting, because $X_0$, $X_1$, $X_2$ and $X_3$ complement the "0" and cause the MOSFETs, whose gates these address codes control, to conduct. The transistor $T_1$ in the memory matrix 13 conducts. Rows $A_2$ and $A_3$ of the decoder 12 does not conduct, because $X_2$, $X_3$ of the address code are at "0" level and cause all the enhancement mode MOSFETs not to conduct. Thus, when $\bar{\phi}$ is high, the MOSFETs $T_5$, and $T_{13}$ are caused to conduct. Then the voltage at point P, which is connected to positive supply VDD through a load transistor TLX1, is pulled down, to a "0" logic level. The signal at P is fed through two inverters 1 and 2 to output at B a signal which is "0". For address code 0001, Row A1 and column $C_2$ of the memory matrix are conducting, while other rows and columns are not conducting. Although $\bar{\phi}$ causes the load devices TLX2 to be on, the conducting path of $A_1$ pulls the down voltage at the gate of $T_2$, causing $T_2$ to be off, the path of $C_1$ is cut off and the potential at P, as well as that at B, is high at logic "1". For address code 1000, column $C_1$ of the Y-decoder conducts, because all the enhancement mode MOSFETs are turned on by the address code, while all the depletion mode MOSFETs are normally on regardless of the address code. Meanwhile, rows $A_1$, $A_2$, $A_3$ do not conduct, all the gates in the memory matrix are pulled high to turn on all the MOSFETs, $T_1$, $T_2$ ... $T_{16}$. With the column $C_1$ conducting, the point P is pulled down to logic "0". For the same reason, P is pulled down to logic "0" for address codes 1001, 1010, 1011. Therefore, for address codes from 1000 to 1011, although the data occupies no MOSFET storage, the information is decoded in the output. The foregoing discussion describes how silence information can be stored without occupying any memory space, and can be reproduced automatically in the circuit.

ADPCM Technique and coding

The method to change PCM code into ADPCM code has been described clearly in S. L. Bates' Master thesis. There is no need to elaborate here. This invention simplifies the hardware implementation of the original circuit. The modifications of the equations for the ADPCM are as follows:

$$S_n = S_{n-1} + \delta \qquad (1)$$

$$\delta = \Delta(n) * |C(n)| * SGN[C(n)] \qquad (2)$$

$$\Delta(n) = Q^{e(n)} * \Delta_{min} \qquad (3)$$

$$\Delta(n+1) = Q^{e(n) + M} * \Delta_{min} \qquad (4)$$

where:

n: $n^{th}$ Sampling time,
$S_n$: Regenerated signal value,
δ: Difference between present signal, value and previous signal value,
(n): Present step size
Q: Stepsize multiplier
M: Multiplier exponent
C(n): ADPCM code words
Δmin: Minimum stepsize
e(n): index of step size
SGN: Sign of C(n)

The present invention features during Encoding a silent period code and Step code. The ADPCM code C(n) and the Multiplier Exponent have the following relationship.

| ADPCM Code Words | | Multiplier Exponent (M) |
|---|---|---|
| Decimal | Binary | Decimal |
| 0 | 0000 | 0 |
| 1 | 0001 | −1 |
| 2 | 0010 | −1 |
| 3 | 0011 | −1 |
| 4 | 0100 | 1 |
| 5 | 0101 | 1 |
| 6 | 0110 | 3 |
| 7 | 0111 | 5 |
| 8 | 1000 | Stop Code |
| −1 | 1001 | −1 |
| −2 | 1010 | −1 |
| −3 | 1011 | −1 |
| −4 | 1100 | 1 |
| −5 | 1101 | 1 |
| −6 | 1110 | 3 |
| −7 | 1111 | 5 |

(4). Then a set of stepsize and address code is obtained as follows:

| Position Code | Stepsize |
|---|---|
| 0 | 2 |
| 1 | 2 |
| 2 | 3 |
| 3 | 3 |
| 4 | 4 |
| 5 | 4 |
| 6 | 5 |
| 7 | 6 |
| 8 | 7 |
| 9 | 8 |
| 10 | 10 |
| 11 | 11 |
| 12 | 13 |
| 13 | 15 |
| 14 | 18 |
| 15 | 21 |
| 16 | 24 |
| 17 | 28 |
| 18 | 33 |
| 19 | 39 |
| 20 | 45 |
| 21 | 53 |
| 22 | 62 |
| 23 | 73 |
| 24 | 85 |
| 25 | 99 |
| 26 | 116 |
| 27 | 136 |
| 28 | 158 |
| 29 | 185 |
| 30 | 217 |
| 31 | 253 |

The major function of this invention is to utilize ADPCM methodology to replay the original sound. The original sound is first encoded into ADPCM code. For replay, the ADPCM code is first decoded into PCM code, and then converted into the original analog signal by means of a digital-to-analog converter.

The encoding of original sound is accomplished in a computer. Sound is amplified first from a microphone or an audio recorder and converted into a 12 bit digital signal. Then the digital signal is encoded into ADPCM code. Since this invention is concerned with the decoding scheme, the encoding scheme is not described here.

ADPCM Decoding and Sound Reproduction

Figure 6:
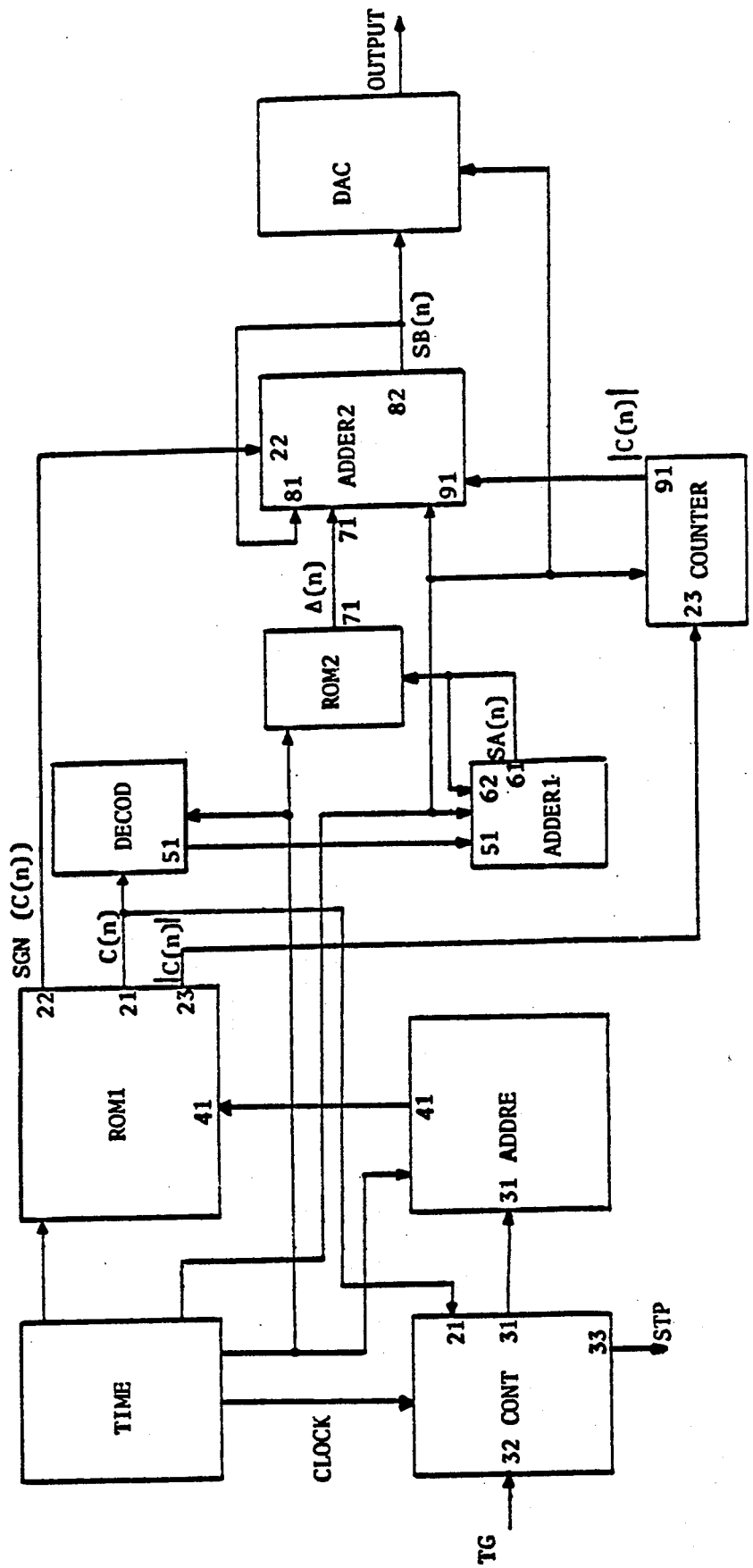

The hardware organization of the present invention is shown in FIG. 6. The first read only memory ROM1 stores the ADPCM code produced from a computer. The ADPCM code varies with varying sound signals. The second read only memory ROM2 stores stepsize values. The function block TIME provides the basic clock pulses for each block. The function block CONT supplies all the control logics for the system. The function block ADDRE supplies the initial address and the address of the data stored in ROM1, under the logic control of TIME and CONT. The ADDRE block also reads the ADPCM code stored in ROM1. The ADPCM code is converted by the decoder DECOD according to Table 1. After decoding, an adder ADDER1 calculates address of the next stepsize in order to read the next stepsize stored in ROM2 (i.e. the values in Table 2). This stepsize value is added to another adder ADDER2 as an addend to the original sum in ADDER2 to obtain a new sum. The number of this interactive summing is determined by a ADPCM code stored in ROM1 by means of a counter COUNTER. After ADDER2 completes the summing, the sum is fed to a digital to analog converter DAC for analog output.

The operating principle of the function blocks are as follows: when power is turned on, ROM2 starting address is 0; the starting signal SB(O) is 0 (i.e. the sum in ADDER2 is 0); TIME function block supplies clock pulses to different function blocks; the system is in stand-by condition. When terminal 32 at the CONT block receives a starting signal TG, a signal is fed from terminal 31 to the ADDRE block, and decoding is started for the address code. Meanwhile a signal is sent from terminal 41 to ROM1. Thereupon, ROM1 begins to fetch ADPCM data code C(n) sequentially according to address code order. This data code feeds from terminal 21 to DECOD to obtain an M value according to Table I. At the same time, the highest number of bits SGN[C(n)] of C(n) is fed to ROM2 through terminal 22. If the signal at terminal 22 is a logic "0", then ADDER2 performs an addition; if "1", then a subtraction. Simultaneously, the second, third and fourth bits [i.e. C(n)] are fed to COUNTER to decide the number of summing iterations for ADDER2. In the beginning, the sum SA(O) of ADDER1 is 0. SA(n) is the address of ROM2. From Table 2, for address 0, the stepsize (O) is 2. This stepsize is the addend, inputting from terminal 71 to ADDER2 to sum with value SB(O) appearing at terminal 81 to obtain a new SB(O) value. If the ADPCM code in ROM1 is 111, the COUNTER output at terminal 91 seven pulses to ADDER2, controlling ADDER2 to sum seven times iteratively. The final sum is SB(1). At this time, the value of SB(1) is 14, which is outputted from the digital to analog converter DAC. When the first ADPCM code is 111, the M value obtained from DECOD according to Table I is +5. From terminal 51, the M value is fed to ADDER1 to sum with value SA(O) at terminal 62 to obtain a value SA(1) at terminal 61. At this time, the sum at ADDER1 is fed to ROM2. From ROM2, the corresponding stepsize (1) is 4, based on Table II. If the second ADPCM code in ROM1 is 0110, the SB(1) value and (1) are added six times to make SB(2) to be 38. If ADPCM is zero, COUNTER is set to zero and ADDER2 stops the summing process. The DAC output does not vary from previous output. If ADPCM is 1000, then the CONT function block sends out from terminal 33 a STP signal which stop the processing of the entire system.

As to the number of sound repetitions, it is also controlled by the CONT function block. The number is simultaneously fed into ROM1 when other data is written into ROM1, When terminal 21 of CONT function block receives a stop code, the CONT function block starts the system operation again repeating as many times as necessary.

Through this technique of ADPCM for the Sound Generator, the bit rate of sound code is reduced from 64 Kb/S to 32 Kb/S. The bit rate is further decreased to 20-26 Kb/S by utilizing the silence elimination and regeneration techniques. For the sound of animals, the memory can be further shrunked to one half or one quarter, because of sound repetition.

What is claimed is:

1. A storage and generation system for sound signal having silence and repetition periods, comprising
   means for converting said sound signal into digital codes using adaptive differential pulse code modulation (ADPCM) technique,
   means for storing in a memory said digital codes except said silence periods and repetition periods,
   means for converting said stored digital codes into analog signal together with said silence period and repetition periods,
   means for converting said ADPCM code in a read only memory based on different signal content,
   said means for storing said ADPCM code and said means for converting said digital signals including:
   (a) Oscillator for generating a basic clock pulse for whole said system,
   (b) Timing generator for generating clocks for different functional blocks,
   (c) Control circuit for controlling the start, repetition and end of said sound signal,
   (d) ROM1 for storing said sound signal codes,
   Address Decoder for outputting decoded addresses from said ROM1,
   (f) Data Decoder for decoding said digital codes from said ROM1,
   (g) ROM2 for storing stepsize values,
   (h) ADDER1 for adding or subtracting data from said decoder and outputting results to addresses of said ROM2,
   (i) ADDER2 for adding or subtracting said size values,
   (j) Data Code Counter for controlling said ADDER2 for continuous addition,
   (k) DAC for transferring the signal from said ADDER2 to corresponding analog signal.

2. A storage and generating system for sound having silence and repetition periods as described in claim 1, wherein said Address Decoder and said ROM1 can automatically generate a signal such as 0000 which is decoded by said address decoder.

3. The claim 1 storage and generating system for sound having silence and repetition periods wherein said ADDER 2 adds a digital signal, such as 0000, appears.

* * * * *